United States Patent [19]
Baier et al.

[11] Patent Number: 5,422,488
[45] Date of Patent: Jun. 6, 1995

[54] REACTOR APPARATUS

[75] Inventors: Michael Baier, Mannheim; Thomas Brendel, Schriesheim; Hilmar Esrom, Neckarhausen, all of Germany

[73] Assignee: Heraeus Holding GmbH, Hanau, Germany

[21] Appl. No.: 123,522

[22] Filed: Sep. 17, 1993

[30] Foreign Application Priority Data

Sep. 18, 1992 [DE] Germany ............... 42 31 367.8

[51] Int. Cl.⁶ .................................................. G01N 21/00
[52] U.S. Cl. .................................................. 250/453.11
[58] Field of Search ............ 250/453.11, 455.11, 250/435, 437

[56] References Cited

U.S. PATENT DOCUMENTS

| | | |
|---|---|---|
| 3,079,498 | 2/1963 | Ruffin ........................ 250/437 |
| 3,769,517 | 10/1973 | Coleman ................ 250/455.11 |
| 3,864,571 | 2/1975 | Stillman ...................... 250/302 |
| 4,002,918 | 1/1977 | Graentzel . |
| 4,296,066 | 10/1981 | Schenck ................... 250/437 |
| 4,448,750 | 5/1984 | Fuesting ................ 250/455.11 |
| 4,786,812 | 11/1988 | Humphreys ............ 250/455.11 |
| 4,798,702 | 1/1989 | Tucker ...................... 250/437 |
| 5,144,144 | 9/1992 | Borovsky ............... 250/455.11 |

FOREIGN PATENT DOCUMENTS

WO90/14158 11/1990 WIPO.

*Primary Examiner*—Bruce C. Anderson
*Attorney, Agent, or Firm*—Herbert L. Lerner; Laurence A. Greenberg

[57] ABSTRACT

A reactor apparatus for treating solid materials, liquids and gases, includes a plurality of units being assembled in modular form.

13 Claims, 5 Drawing Sheets

REACTOR APPARATUS

BACKGROUND OF THE INVENTION

FIELD OF THE INVENTION

The invention relates to a reactor apparatus for treating solid materials, liquids and gases.

Such a reactor apparatus is used, for instance, to metallize components of arbitrary geometry. The metallizing is performed by the photolytic decomposition of an organic metal compound by UV light, and the UV light is produced by excimers.

SUMMARY OF THE INVENTION

It is accordingly an object of the invention to provide a reactor apparatus, which overcomes the disadvantages of the heretofore-known devices of this general type since it can be constructed in terms of its dimensions in such a way that it can be adapted at any time to the size and geometry of the components, semi-finished products and raw products to be processed.

With the foregoing and other objects in view there is provided, in accordance with the invention, a reactor apparatus for treating solid materials or stock, liquids and gases, comprising a plurality of units being assembled in modular form.

According to the invention, every reactor apparatus is made up of a plurality of units. Each of these units may be variably constructed and is itself graduated by model series. In addition, two or more units may be assembled detachably or permanently to make a model. Each unit is constructed of such a kind is and provided with flanges in such a way that it can be combined with any other unit. This furnishes a modular system with which it is possible to construct different reactor variants using the existing units. Each reactor apparatus can thus be adapted without difficulty to the geometries and dimensions of the components and workpieces to be processed and worked.

In accordance with another feature of the invention, the units include at least one lamp unit, one basic unit, one charging unit and one supply and disposal unit being put together in modular fashion, in form-locking fashion (with interlocking shapes), or in material-locking fashion (being integral with each other). The lamp unit serves to receive high-powered UV projectors, emitters or radiators, having a number which can be adapted to the size of the regions of the components to be processed and worked. High-power UV projectors can be inserted into each lamp unit and are constructed as round projectors, flat projectors, spherical projectors, cup projectors, finger projectors, internal projectors, or external projectors. Moreover, cooling devices for the projectors or projector electrodes, blind flanges, and reducing adaptors, in order to enable the use of projectors with variable diameters and lengths, or a variable number of projectors, are provided in the lamp unit. Projector electrodes are a special type of projectors. They make it possible to operate the reactor as an open projector. The high-power UV projectors are preferably disposed on mounts that are detachably built into the lamp unit, so that they can be replaced as a prefabricated component group. Accessory parts include high-frequency generators, adaptation transformers, and water coolers. The basic unit makes it possible to generate a vacuum, if the particular processing form requires that. Moreover, charging the unit with gases, if that is needed, is also possible with this unit. The development of a vacuum in the interior of each reactor apparatus is done by connecting a vacuum pump to the basic unit. Measuring, control and monitoring connections are also provided in the basic unit. The basic unit also serves to receive at least one positioning device. Preferably, at least one horizontally movable support that is adjustable in height from outside is provided in each basic unit, and the component to be processed can be disposed on this support. The support may be constructed as a table, clamp table, or chucking device. The charging unit includes at least one charging device that guarantees that the charging can be done in continuous or batch operation. The charging unit is provided on two opposite sides with closable and/or blockable openings, by way of which the components to be processed are transported into the reactor apparatus. Preferably, the charging apparatus has flanges, manipulators, inverters, deflection rollers, and connection necks. In addition, it may be equipped with partitioning disks of quartz, by way of which its interior region can be partitioned off from the adjoining units. This makes it possible to carry out CVD processes, in order to process surfaces in the reactor apparatus as well. Preferably, however, a coating that is intended to undergo further processing afterward in the reactor apparatus is applied to the component by a known process in a separate chamber. In the reactor apparatus, this coating can then be further treated by means of UV light, and if intended can be converted into a metal layer. The possibility also exists of operating the reactor apparatus with open projectors. Besides the units mentioned above, there is also a supply and disposal unit. Ozone, which is produced at the ends of the projectors in air if appropriate high-power UV projectors are disposed in an overhanging fashion, is disposed of through this supply and disposal unit. The supply and disposal unit therefore has at least one suction device, by way of which this ozone can be removed from the reactor apparatus and delivered to an ozone destroyer. It also has ducts for lines of a voltage supply required to operate the projectors and for cooling.

In accordance with a further feature of the invention, the units include at least two units selected from the group consisting of lamp units, basic units, charging units and supply and disposal units (so that individual units may be omitted depending on the particular application), having variable structures and being put together in modular fashion, regardless of their structure.

In accordance with an added feature of the invention, the lamp unit has at least one high-power UV projector with a longitudinal axis being disposed in a horizontal or vertical plane, and at least one mount being removable from the lamp unit for securing the high-power UV projector, or the lamp unit has a housing wall and at least one high-power UV projector being built directly into the lamp unit and over-hanging the housing wall.

In accordance with an additional feature of the invention, the charging device is constructed for continuous or batch operation and has openings or slits formed therein for charging the charging device being closable with a gas or mechanically blockable, and including bulky or large-surface-area components to be pulled through the slits, and a battery of internal projectors to which gaseous or liquid substances can be delivered for processing after being introduced to the openings.

In accordance with yet another feature of the invention, the basic unit has a horizontally movable support being adjustable in height from outside and being constructed as a cable, lamp table or slide device, at least one mounting flap, a viewing window, flanges with predetermined connection sizes and connection necks having predetermined dimensions.

In accordance with yet a further feature of the invention, the supply and disposal unit has ducts for voltage supply lines, coolant inflow and outflow lines, and a suction device.

In accordance with yet an added feature of the invention, the lamp unit, the basic unit, and the charging unit have housings made of a corrosion-resistant metal, preferably V2A steel or aluminum, and the supply and disposal unit has a housing made of synthetic resin materials sold under the trademark PLEXIGLAS.

In accordance with yet an additional feature of the invention, there is provided at least one module each having one lamp unit and one supply and disposal unit, at least one other module each having one basic unit and one charging unit, at least two of the modules being permanently or detachably joined, a wall separating the modules from one another, lateral surfaces having charging openings formed therein, and doors for closing the openings.

In accordance with a concomitant feature of the invention, there are provided quartz disks, at least one of the quartz disks being disposed between each two respective units, for using the reactor apparatus as an open projector device, or for assuring the passage through it of gas phase processes induced by high-power UV light.

Other features which are considered as characteristic for the invention are set forth in the appended claims.

Although the invention is illustrated and described herein as embodied in a reactor apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
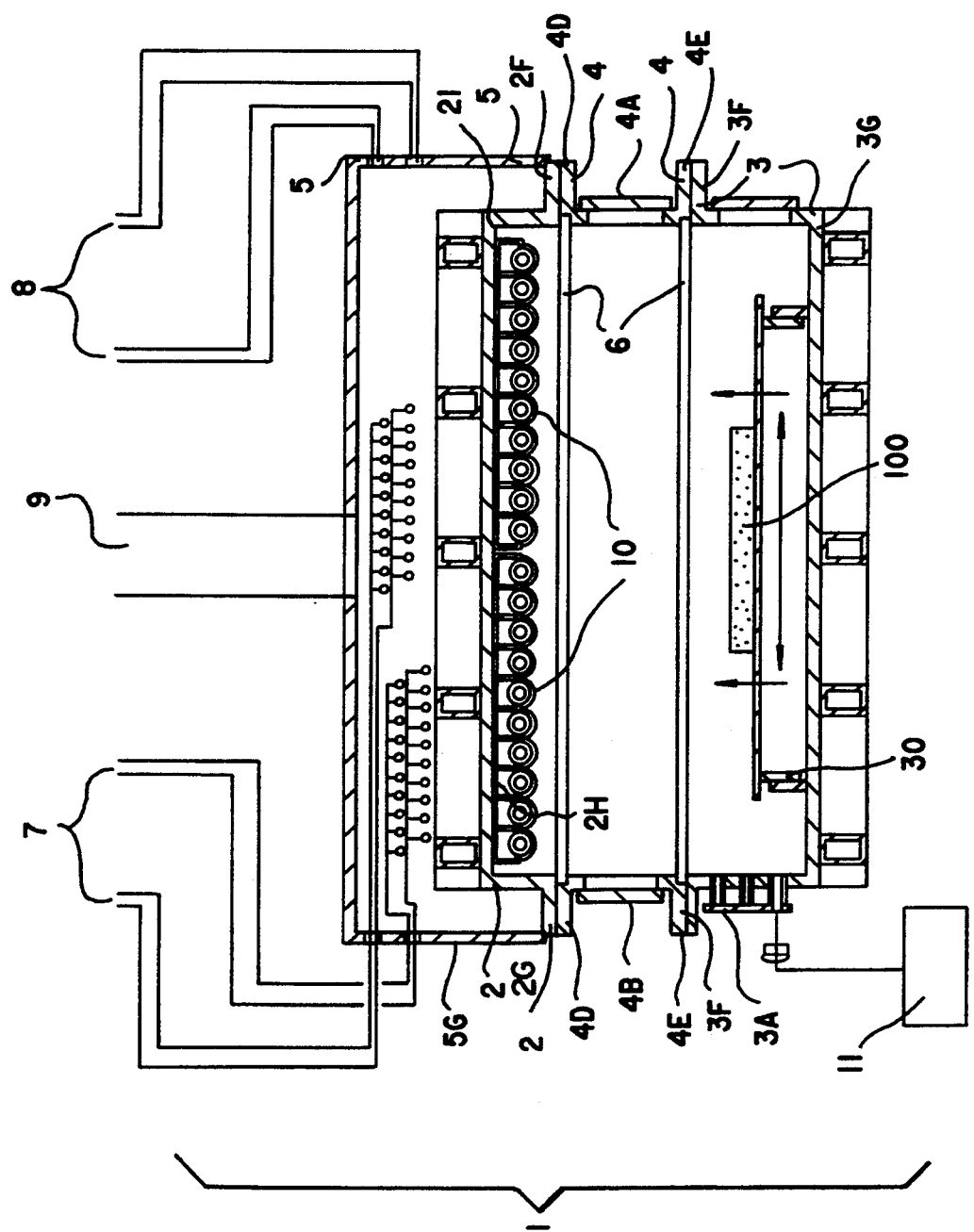
FIG. 1 is a diagrammatic vertical-sectional view of a reactor apparatus in modular form.

Referring now to the figures of the drawing in detail and first, particularly, to FIG. 1 thereof, there is seen a reactor apparatus 1 which includes a lamp unit 2, a basic unit 3, a charging unit 4, and a supply and disposal unit 5. The units 2, 3, 4 and 5 are constructed in such a way that they are manufactured separately and can be put together to make the reactor apparatus 1. The lamp unit 2 has a U-shaped cross section and is formed by an elongated, block-shaped housing 2G, which is open on one side. The housing 2G is made of aluminum or V2A steel. High-power UV projectors, emitters or radiators 10 are disposed on a single large inner surface 2I in such a way that their longitudinal axes extend parallel to the longitudinal axis of the inner surface 2I. The high-power projectors 10 are detachably inserted into the lamp unit 2 and can be removed from it at any time and replaced with others. The lamp unit 2 is provided with outwardly pointing flanges 2F on its lateral boundary surfaces. These flanges are mounted on outwardly pointing flanges 4D of the charging unit 4. The housing 2G of the lamp unit 2 is open toward the charging unit 4. The likewise block-shaped charging unit 4 is put together from four U-profiles, which are made of aluminum or V2A steel, and are disposed in such a way that the outwardly oriented flanges 4D and outwardly oriented flanges 4E are formed. The inside diameter of the charging device 4 is adapted to the inside diameter of the lamp unit 2. The charging unit 4 may be open toward the lamp unit 2, or partitioned off from it by quartz disks 6. The charging unit 4 is mounted by the flanges 4E thereof onto outwardly pointed flanges 3F of the basic unit 3. The basic unit 3 is defined by a block-shaped housing 3G, which is constructed like the lamp unit 2. The inside diameter of the basic unit 3 is adapted to the inside diameter of the charging unit 4 and is open toward it. The three units 2, 3 and 4 are joined together in gas-tight fashion by their flanges 2F, 3F, 4D and 4E. The flanges 2F, 3F, 4D and 4E are manufactured to fixed dimensions, so that units with identical inside diameters can always be put together. The connection may be performed detachably by means of screws or permanently by welding. The supply and disposal unit 5 likewise has a block-shaped form. The supply and disposal unit 5 has ducts for electrical voltage supply lines 7 and inflow and outflow lines 8 for a coolant. These lines 7 are required for operating the high-power projectors 10. A housing 5G defining the unit 5 is made of synthetic resin materials sold under the trademark PLEXIGLAS. As can be seen from FIG. 1, the dimensions of the housing 5G are selected in such a way that it covers the lamp unit 2 and the outwardly pointing flanges 2F thereof, and with its lateral boundary surfaces it is seated on outer edges of the flanges 2F. The supply and disposal unit 5 is also provided with a suction device 9, which may optionally be connected to a non-illustrated ozone destroyer. The suction device 9 may be omitted if the high-power UV projectors 10 are disposed in such a way that they do not overhang the housing 2G of the lamp 2, or if no ozone-generating high-power UV projectors 10 are used.

Figure 2:
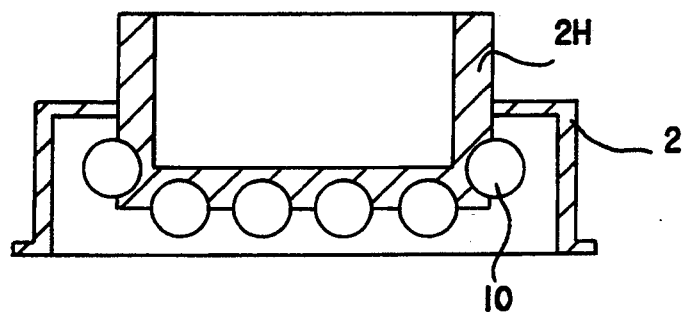
FIG. 2 is an enlarged, vertical-sectional view of a lamp unit.

As can be seen from FIG. 2, high-power UV projectors 10 that are secured to an adjustable-height mounting device 2H may be disposed in the lamp unit 2. The mounting device 2H has a U-shaped cross section. The high-power UV projectors 10 are disposed at a defined spacing on the outer surface of the mounting device 2H. The mounting device 2H can be removed from the lamp unit 2 in a simple manner and replaced by another one, on which more or fewer high-power UV projectors 10 may, for instance, be disposed.

Figure 3:
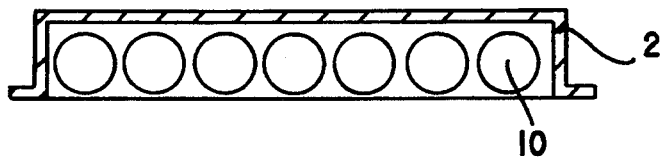
FIG. 3 is a vertical-sectional view of a variant of the lamps shown in FIG. 2.

A variant of the lamp unit is shown in FIG. 3. In this case high-power UV projectors 10, as shown in FIG. 1, are disposed at a defined spacing in such a way that their longitudinal axes extend parallel to one another and are disposed in a horizontal plane. The ends of the high-power UV projectors 10 in this embodiment overhang the walls of the lamp unit 2.

Figure 4:
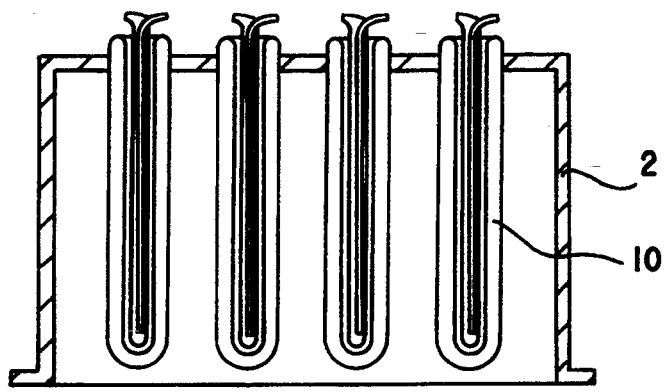
FIG. 4 is a vertical-sectional view of a further embodiment of the lamp unit.

In another embodiment of the lamp unit 2 as shown in FIG. 4, the high-power UV projectors 10 are disposed in such a way that their longitudinal axes extend in a vertical plane, parallel to and at a defined spacing from one another. In that embodiment of the lamp unit 2 as well, the ends of the high-power UV projectors 10 overhang the housing of the lamp unit.

Figure 5:
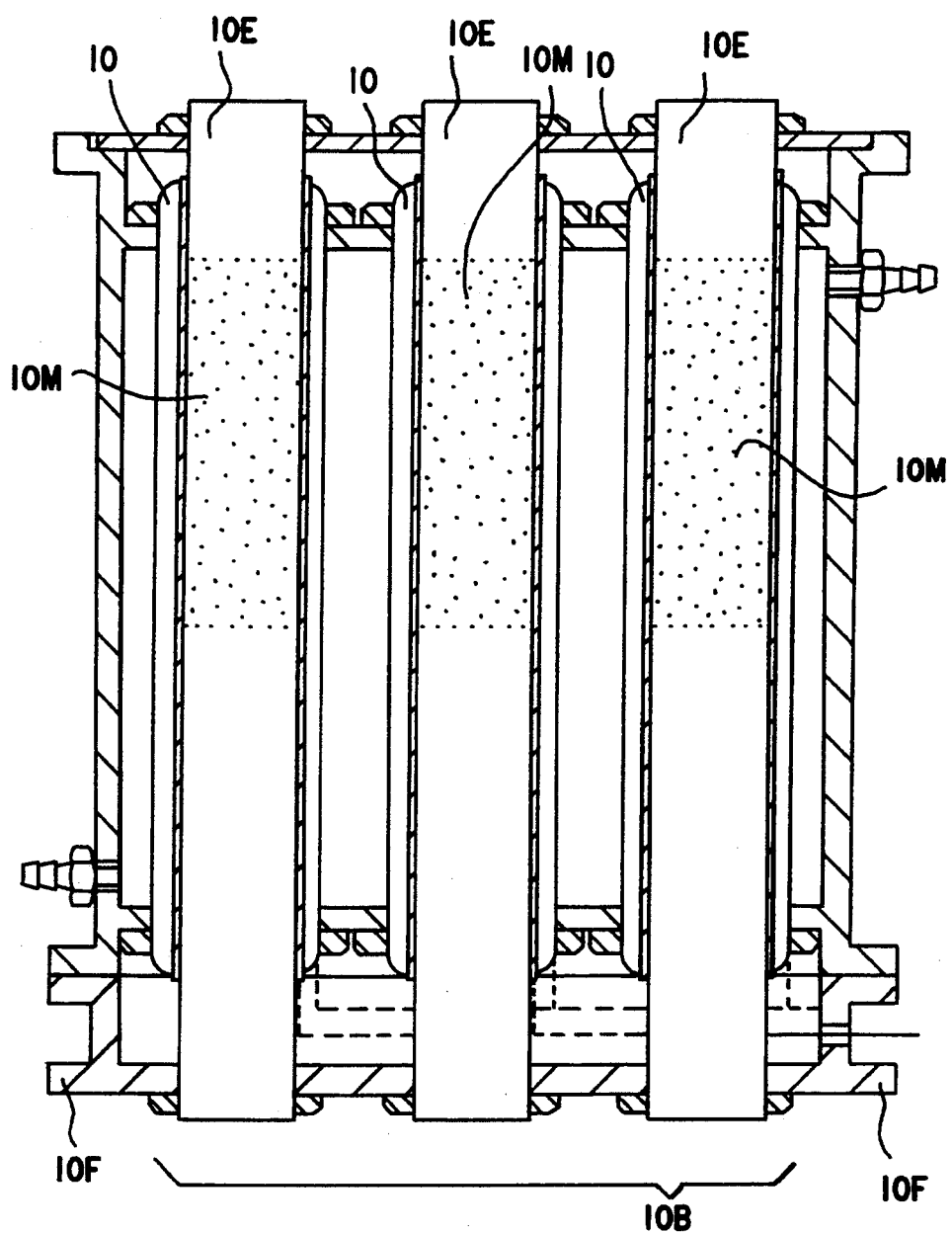
FIG. 5 is an enlarged, vertical-sectional view of a battery of internal projectors.

FIG. 5 shows a section through a battery 10B of internal projectors, which in this case is formed by three high-power UV projectors 10. The number of high-power projectors 10 is not limited to three but instead can be chosen arbitrarily. These high-power UV projectors 10 are constructed in such a way that a flowing medium 10M, in the form of a liquid or a gas, can be passed through their internal region 10E and thereby exposed to the action of UV light or radiation.

In the same way, a non-illustrated solid-state body with adapted dimensions may be transported through the internal projectors 10 and irradiated. This battery 10B of internal projectors may be used individually as a special model of the modular set, or it may be connected firmly or in material-locking fashion through its flanges 10F to the charging unit 4 or the base unit 3.

Figure 6:
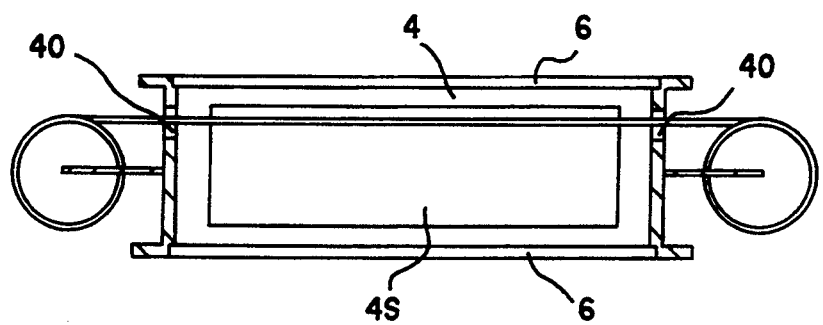
FIG. 6 is a vertical-sectional view of a charging unit.

FIG. 6 shows a possible embodiment of a charging unit 4 that is suitable for continuous operating. The charging unit 4 is provided with openings 40 on two opposite sides. These openings may be closed or blocked, for instance with the aid of a gas, or mechanically. The charging unit 4 may additionally be provided with non-illustrated flanges, manipulators, inverters, deflecting rollers, quartz disks and connection necks.

Figure 7:
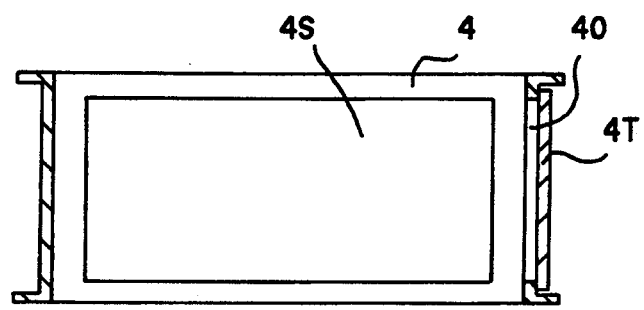
FIG. 7 is a vertical-sectional view of a variant of the charging unit shown in FIG. 6.
Figure 8:
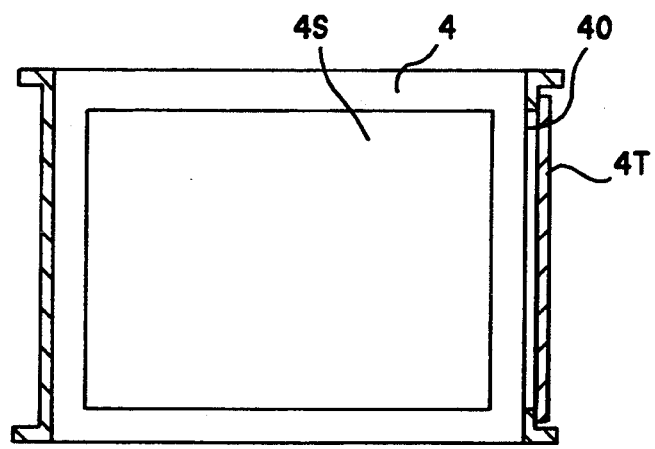
FIG. 8 is a vertical-sectional view of a further embodiment of the charging unit shown in FIG. 7.

FIGS. 7 and 8 show further embodiments of the charging unit 4 in vertical section. The charging unit 4 of FIG. 7 has an opening 40 that is closed by a door 4T. In FIG. 8, a charging unit 4 is shown that is constructed to be higher in its dimensions than the unit 4 of FIG. 7 and is provided with a viewing window 4S. This is intended to illustrate the modular versatility of the units 4, which naturally also exists in all of the other units 2, 3 and 5.

Figure 9:
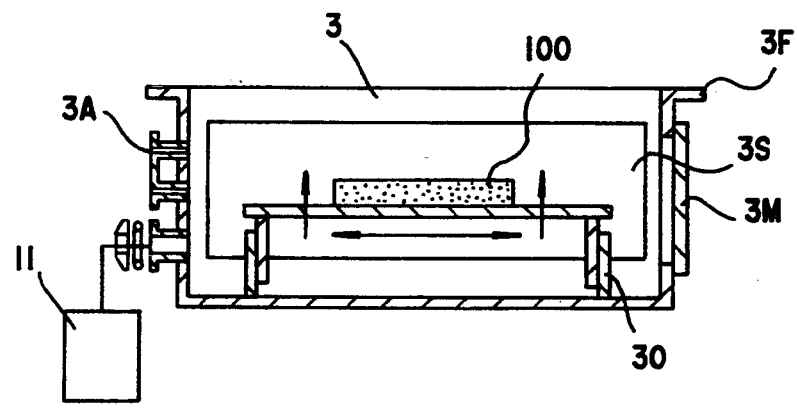
FIG. 9 is a vertical-sectional view of a basic unit.

FIG. 9 shows the basic unit 3, which is again of block-shaped form, in vertical section. The basic unit 3 is connected to a vacuum pump 11. Located in the interior of the basic unit 3 is a support 30, which is adjustable in height and horizontally movable. A component 100 to be processed is placed on the support 30. The support 30 may be constructed as an adjustable-height table, as shown herein, or as a non-illustrated clamp table or as a non-illustrated displaceable chucking device. As needed, the support 30 may be removed from the basic unit 3 through the charging unit 4. Moreover, the basic unit 3 is provided with connection necks 3A, non-illustrated manipulators, blind flanges, sealing rings, flanges, thermocouples, coaxial cable ducts, bellows-type hoses, valves, connecting elements, pressure gauges, pressure indicator devices, temperature indicator devices, photodiodes, measured value amplifiers, and measured value plotters.

Figure 10:
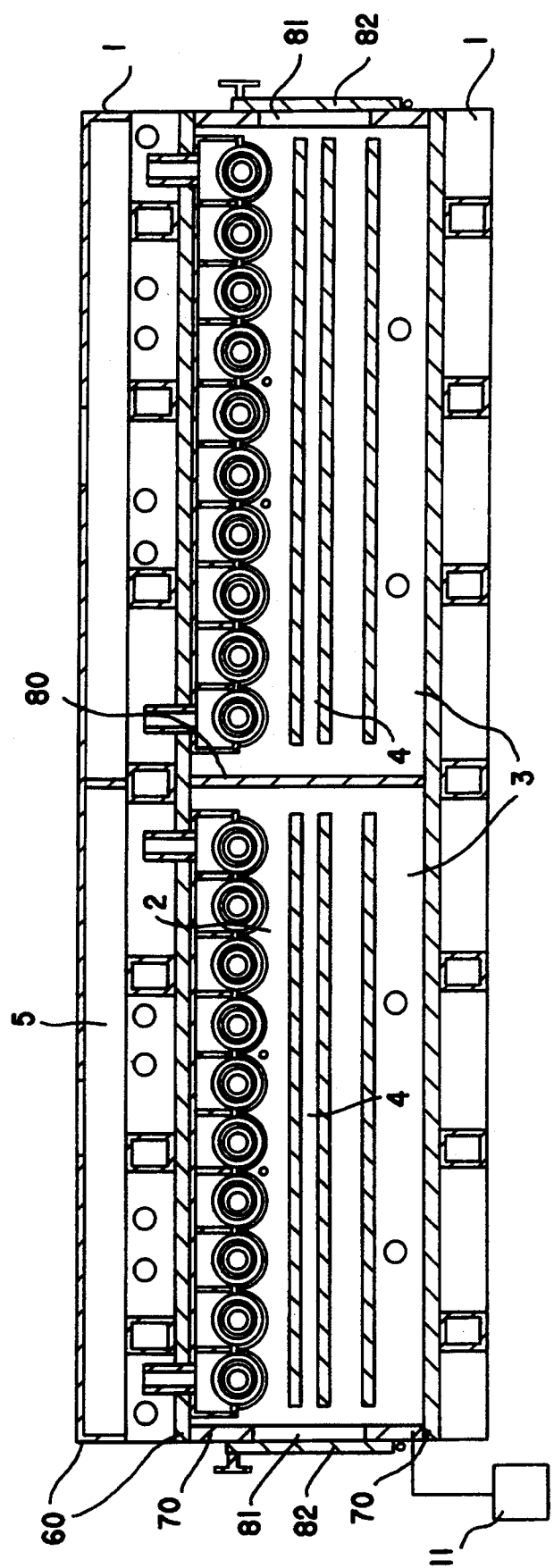
FIG. 10 is a vertical-sectional view of a variant of the reactor apparatus shown in FIG. 1.

FIG. 10 shows a variant of the reactor apparatus 1 according to the invention, which is assembled from a plurality of units 2, 3, 4 and 5, with each unit 2 and 5 being assembled to make a module 60 and each unit 3 and 4 being assembled to make a module 70. As can be seen from FIG. 10, the reactor apparatus 1 has two modules 60 and two modules 70. The two modules 60 and the two modules 70 are disposed next to one another and are separated from one another by a wall 80. All of the modules 60 and 70 are permanently connected to one another. Through the use of the wall 80, the reactor apparatus 1 is subdivided into two regions. This enables parallel or anticyclic processing of two components disposed on non-illustrated supports. The charging is done through openings 81, which are disposed on the lateral boundary surfaces of the reactor apparatus 1 and are closed with doors 82. The invention is not limited to the combination of the units to make the modules 60 and 70 shown herein, but instead encompasses all of the other combinations suitable for producing a coating.

We claim:

1. A reactor apparatus for treating solid materials, liquids and gases, comprising a plurality of units including at least one lamp unit; a basic unit having at least one of means for generating a vacuum, means for charging the reactor apparatus with gases, means for providing measuring, control and monitoring connections, and means for receiving at least one positioning device; and one charging unit, said charging unit including a charging device for charging the reactor apparatus in one of continuous and batch operation; each of said units having connection means for connecting one of said units to an adjacent one of said units, said connection means having a form-fitting structure allowing a form-fitting connection between any of said units.

2. The reactor apparatus according to claim 1, wherein said lamp unit has at least one high-power UV projector with a longitudinal axis being disposed in a horizontal or vertical plane, and at least one mount being removable from said lamp unit for securing said high-power UV projector.

3. The reactor apparatus according to claim 1, wherein said lamp unit has a housing wall and at least one high-power UV projector being built directly into said lamp unit and overhanging said housing wall.

4. The reactor apparatus according to claim 1, wherein said charging device is constructed for continuous or batch operation and has openings or slits formed therein for charging said charging device being closable with a gas or mechanically blockable, and including bulky or large-surface-area components to be pulled through said slits, and a battery of internal projectors to which gaseous or liquid substances can be delivered for processing after being introduced to the openings.

5. The reactor apparatus according to claim 1, wherein said basic unit has a horizontally movable support being adjustable in height from outside and being constructed as a cable, lamp table or slide device, at least one mounting flap, a viewing window, flanges with predetermined connection sizes and connection necks having predetermined dimensions.

6. The reactor apparatus according to claim 1, wherein said supply and disposal unit has ducts for voltage supply lines, coolant inflow and outflow lines, and a suction device.

7. The reactor apparatus according to claim 1, wherein said lamp unit, said basic unit, and said charging unit have housings made of a corrosion-resistant metal, and said supply and disposal unit has a housing made of synthetic resin materials sold under the trademark PLEXIGLAS.

8. The reactor apparatus according to claim 7, wherein said corrosion-resistant metal is selected from the group consisting of V2A steel and aluminum.

9. The reactor apparatus according to claim 1, including quartz disks, at least one of said quartz disks being disposed between each two respective units, for using the reactor apparatus as an open projector device.

10. The reactor apparatus according to claim 1, including quartz disks, at least one of said quartz disks being disposed between each two respective units, for passage of gas phase processes induced by high-power UV light.

11. The reactor apparatus according to claim 1, wherein said connection means are in the form of a flange projecting outwardly from said respective unit.

12. A reactor apparatus for treating solid materials, liquids and gases, comprising a plurality of units being assembled in modular form, said units including at least one lamp unit, one basic unit, one charging unit and one supply and disposal unit being put together in modular fashion, and at least one module each having one lamp unit and one supply and disposal unit, at least one other module each having one basic unit and one charging unit, at least two of said modules being permanently or detachably joined, a wall separating said modules from one another, lateral surfaces having charging openings formed therein, and doors for closing the openings.

13. A reactor apparatus for treating solid materials, liquids and gases, comprising a plurality of units including at least one lamp unit; a basic unit having at least one of means for generating a vacuum, means for charging the reactor apparatus with gases, means for providing measuring, control and monitoring connections, and means for receiving at least one positioning device; one charging unit, said charging unit including a charging device for charging the reactor apparatus in one of continuous and batch operation; and at least one supply and disposal unit with a suction device for removing ozone from the reactor apparatus, said supply and disposal unit having ducts formed therein with voltage supply lines, and said supply and disposal unit having interlocking shapes such that it may be put together with any of said lamp, basic and charging units.

* * * * *

UNITED STATES PATENT AND TRADEMARK OFFICE
CERTIFICATE OF CORRECTION

PATENT NO.  : 5,422,488
DATED       : June 6, 1995
INVENTOR(S) : Michael Baier, et al It is certified that error appears in the above-indentified patent and that said Letters Patent is hereby corrected as shown below:

On title page, item [73]

"Heraeus Holding GmbH, Hanau"

should read

-- Heraeus Noblelight GmbH, Hanau --.

Signed and Sealed this

Ninth Day of July, 1996

BRUCE LEHMAN

*Attest:*

*Attesting Officer*    Commissioner of Patents and Trademarks